(12) United States Patent
Abedifard et al.

(10) Patent No.: US 8,313,960 B1
(45) Date of Patent: Nov. 20, 2012

(54) MAGNETIC TUNNEL JUNCTION (MTJ) FORMATION USING MULTIPLE ETCHING PROCESSES

(75) Inventors: Ebrahim Abedifard, Sunnyvale, CA (US); Parviz Keshtbod, Los Altos, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/371,380

(22) Filed: Feb. 10, 2012

Related U.S. Application Data

(63) Continuation-in-part of application No. 13/100,048, filed on May 3, 2011, now Pat. No. 8,148,174.

(51) Int. Cl.
*H01L 21/00* (2006.01)
(52) U.S. Cl. .............. 438/3; 438/238; 438/396
(58) Field of Classification Search .......... 438/3, 238, 438/239, 240, 253, 396, 399
See application file for complete search history.

(56) References Cited

U.S. PATENT DOCUMENTS

| 6,638,774 B2 * | 10/2003 | Raberg ............... 438/3 |
| 6,794,695 B2 * | 9/2004 | Sharma et al. ........ 257/295 |
| 7,052,941 B2 * | 5/2006 | Lee ................... 438/152 |
| 7,351,594 B2 * | 4/2008 | Bae et al. ............. 438/3 |
| 7,825,000 B2 * | 11/2010 | Kanakasabapathy et al. ........... 438/401 |
| 2007/0148789 A1 * | 6/2007 | Bae et al. ............ 438/3 |

* cited by examiner

*Primary Examiner* — Kevin M Picardat
(74) *Attorney, Agent, or Firm* — Maryam Imam; IPxLaw Group LLP

(57) ABSTRACT

A method of manufacturing a magnetic memory element includes the steps of forming a permanent magnetic layer on top a bottom electrode, forming a pinning layer on top the permanent magnetic layer, forming a magnetic tunnel junction (MTJ) including a barrier layer on top of the pinning layer, forming a top electrode on top of the MTJ, forming a hard mask on top of the top electrode, and using the hard mask to perform a series of etching processes to reduce the width of the MTJ and the top electrode to substantially a desired width, where one of these etching processes is stopped when a predetermined material in the pinning layer is detected thereby avoiding deposition of metal onto the barrier layer of the etching process thereby preventing shorting.

17 Claims, 16 Drawing Sheets

MAGNETIC TUNNEL JUNCTION (MTJ) FORMATION USING MULTIPLE ETCHING PROCESSES

CROSS REFERENCE TO RELATED APPLICATIONS

This application is a continuation-in-part (CIP) of U.S. patent application Ser. No. 13/100,048, filed on May 3, 2011, by Abedifard et al., and entitled "Magnetic Tunnel Junction (MTJ) Formation With Two-Step Process", incorporated herein by reference as though set forth in full.

BACKGROUND OF THE INVENTION

1. Field of the Invention

The invention relates generally to non-volatile magnetic memory and particularly to manufacturing magneto (also referred to as "magnetic") tunnel junction (MTJ) included in the non-volatile magnetic memory.

2. Description of Prior Art

It is well known that current memory is experiencing its manufacturing limitations and is subject to dramatically change in the coming years. Magnetic memory offers an alternative to replacing current memory however, manufacturing of magnetic memory, such as magnetic random access memory (MRAM), is experiencing its own set of problems. Challenges, not easy to overcome, remain largely in the fabrication of scalable and reliable magneto (also referred to as "magnetic") tunnel junction (MTJ), an active and vital part of the MRAM. An MRAM element is typically made of MTJ and surrounding layers, all formed on a substrate. The MTJ generally serves to save information or data by changing its magnetic orientation, which in some MTJs occurs upon the flow of suitable electrical current through the MTJ.

In these types of MTJs, the MTJ is typically made of a fixed layer, fixed in its magnetic orientation, a barrier layer, and a free layer whose magnetic orientation defines the state of the MTJ's and is switchable according to the current flowing therethrough, relative to the magnetic orientation of the fixed layer.

A tantalum layer is typically formed on top of the MTJ and used to establish a connection to the MTJ for incorporating the MTJ in the MRAM. As discussed above, the MTJ is made of a free layer, typically formed below the tantalum layer, a barrier or MgO layer, formed below the free layer, and a fixed layer formed under the MgO layer. The barrier layer is obviously not a metal layer whereas the free and fixed layers are made of metal. Various layers are formed below the fixed layer and above a metal layer, within or above the substrate, in an effort to help the fixed layer maintain its permanent magnetic orientation. During manufacturing, when etching to form the magnetic memory element (or MRAM element), the metals of the layers below the MgO layer, including the metal layer (typically made of copper) result in some of the metal being re-deposited onto the MgO layer therefore undesirably causing shorting. That is, this detrimentally causes defective MRAM elements because the fixed and free layers are effectively shorted together across the barrier (MgO) layer that is positioned between the fixed and free layers.

What is needed is reliable manufacturing of MRAM elements.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device and a method of manufacturing the same that is reliable.

Briefly, a method of manufacturing a magnetic memory element includes the following steps. The manufacturing of a magnetic memory element includes the steps of forming a permanent magnetic layer on top a bottom electrode, forming a pinning layer on top the permanent magnetic layer, forming a magnetic tunnel junction (MTJ) including a barrier layer on top of the pinning layer, forming a top electrode on top of the MTJ, forming a hard mask on top of the top electrode, and using the hard mask to perform a series of etching processes to reduce the width of the MTJ and the top electrode to substantially a desired width, where one of these etching processes is stopped when a predetermined material in the pinning layer is detected thereby avoiding deposition of metal onto the barrier layer of the etching process thereby preventing shorting.

These and other objects and advantages of the present invention will no doubt become apparent to those skilled in the art after having read the following detailed description of the preferred embodiments illustrated in the several figures of the drawing.

IN THE DRAWINGS

Figure 2:
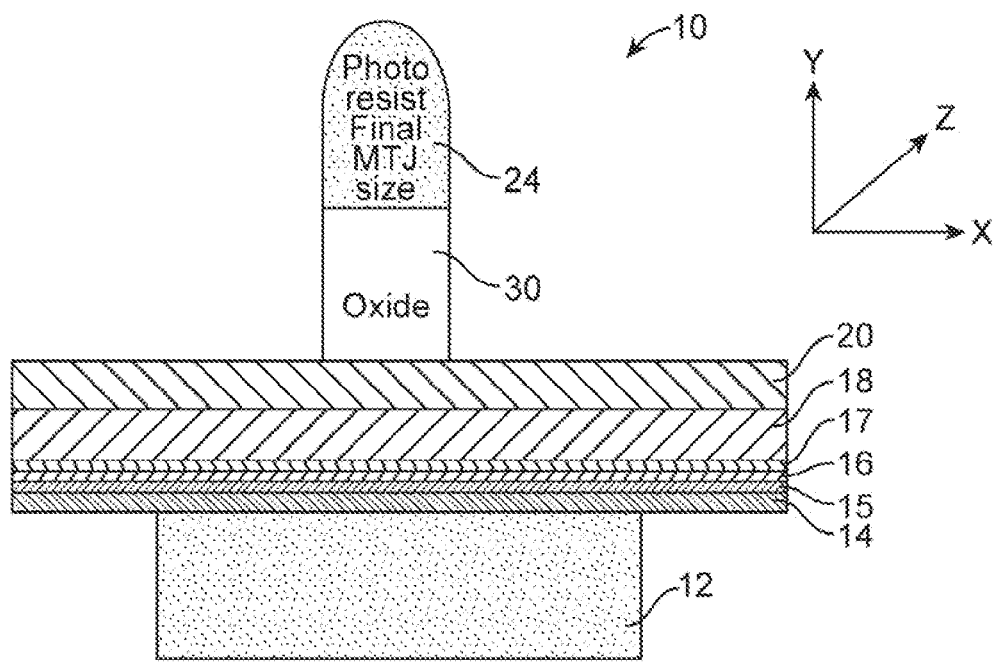
FIG. 2 shows the MRAM element 10 after etching of the oxide layer 22.
Figure 3:
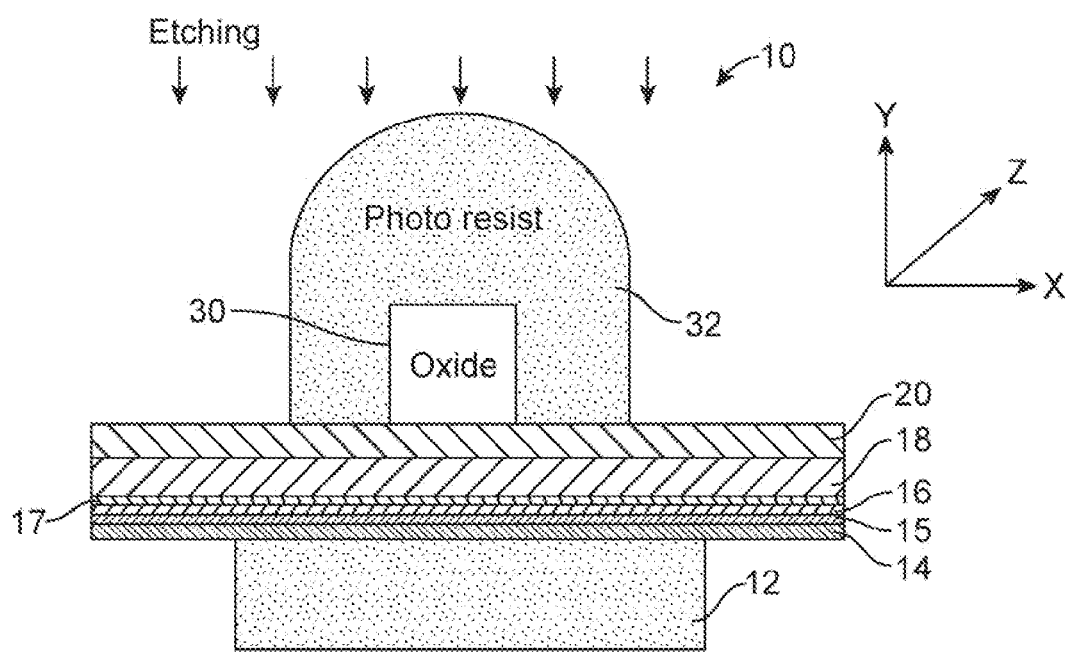

FIG. 3 shows the step of depositing photo-resist 32 on top of and around the portion of the oxide layer 30 after the etching step of FIGS. 2 and 3.

Figure 4:
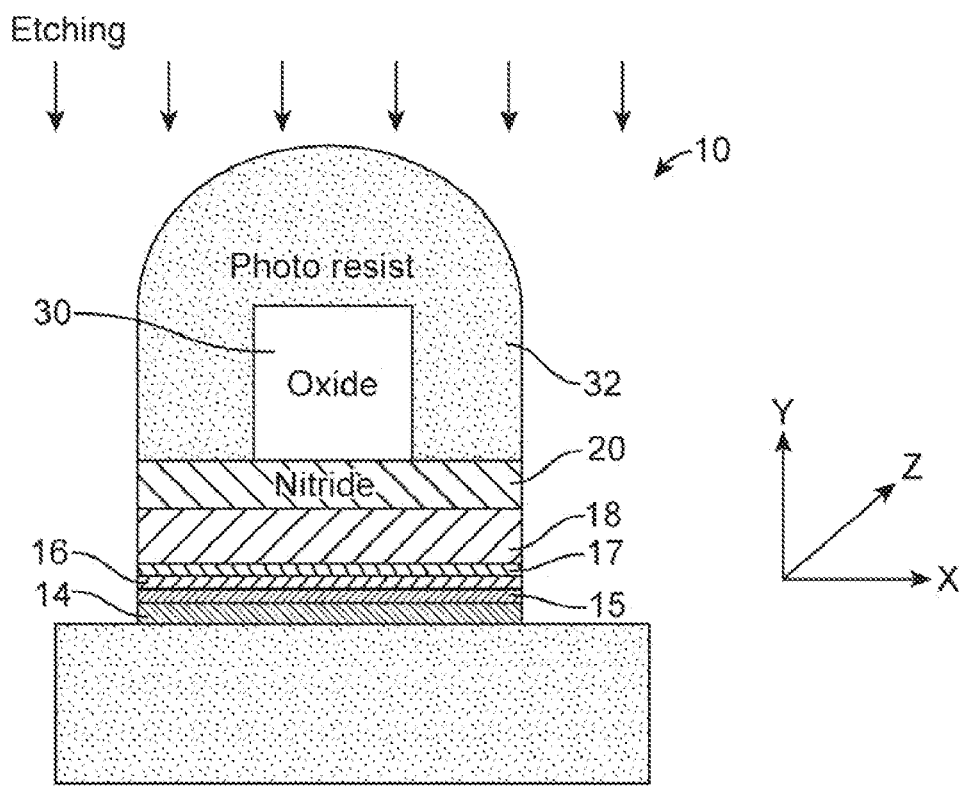

FIG. 4 shows the element 10 after the etching step of FIG. 3.

Figure 5:
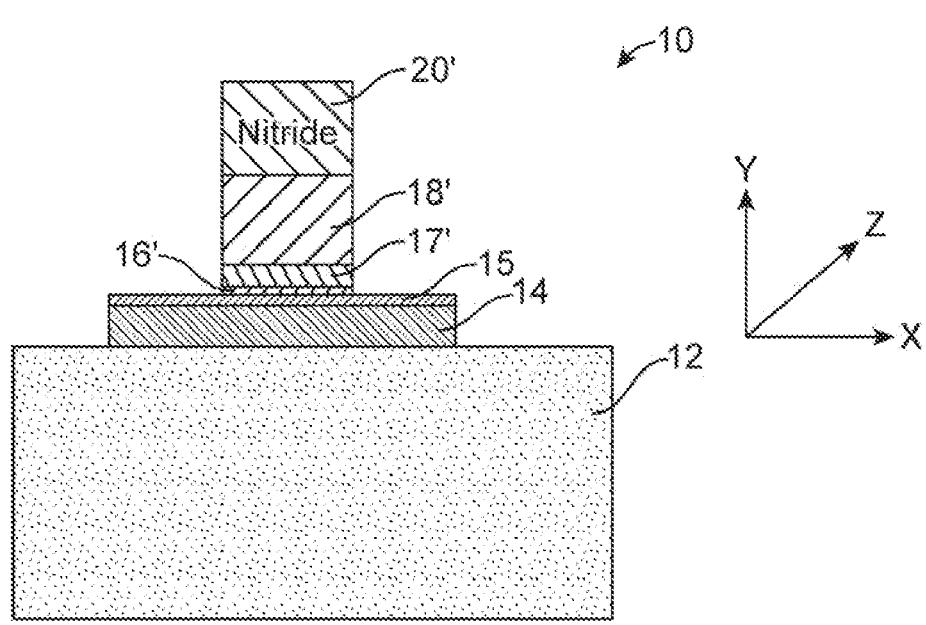

FIG. 5 shows the element 10 after the etching step of FIG. 4.

Figure 6:
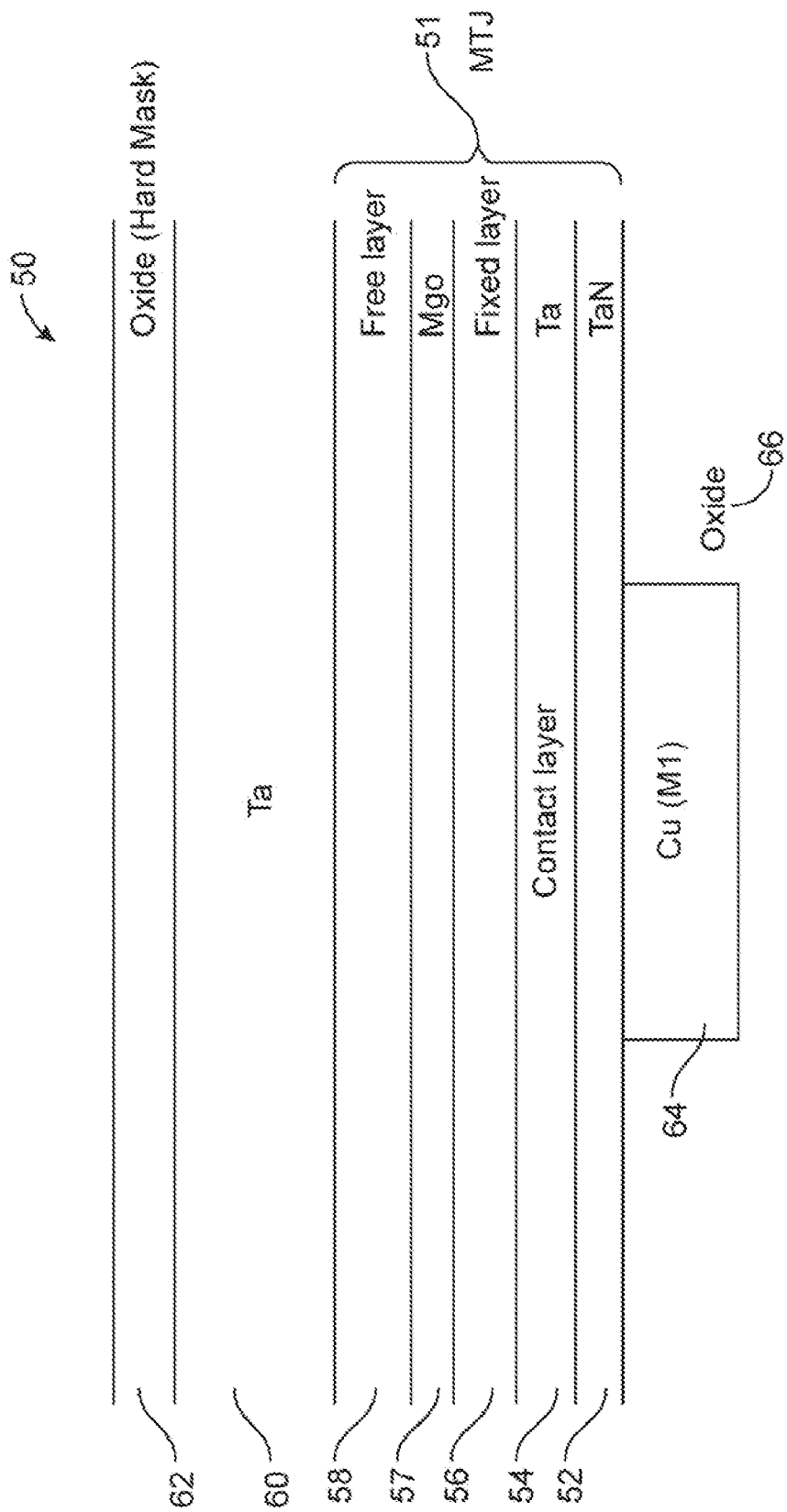

FIG. 6 shows a MRAM element 50, in accordance with an embodiment and method of the present invention.

FIGS. 7-11 show an alternative embodiment and method employed to manufacture the MRAM element 50, FIGS. 12-18 show the steps employed in manufacture the MRAM element 10, in accordance with a method of the invention.

DETAILED DESCRIPTION OF THE VARIOUS EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

A method of manufacturing a magnetic memory element is disclosed. During a first etching step, an oxide layer is etched using a first photo-resist, to leave a portion of the oxide layer, the portion of the oxide layer has a length and a width. The oxide layer is formed on top of a contact layer, the contact layer is formed on top of a free layer, the free layer is formed on top of a barrier layer, the barrier layer is formed on top of a fixed layer, and the fixed layer is formed on top of a metal layer. The metal layer is deposited along the plane of a substrate. The free layer, barrier layer and fixed layer define a magneto tunnel junction (MTJ) and the MTJ and contact layer define a MTJ stack. The width of the portion of the oxide layer is defined along the plane of the substrate and has a size that is substantially the size of a desired width of the free layer after manufacturing of the magnetic memory element. The length of the portion of the oxide layer is substantially perpendicular to the width thereof where the length of the portion of the oxide layer extends from the top of the contact layer to the bottom of the first photo-resist. Additionally, a second photo-resist is deposited on top of and around the portion of the oxide layer and a second etching step is performed of the MTJ stack, using the second photo-resist, to leave a portion of the contact layer, a portion of the free layer and a portion of the barrier layer, each of the portion of the contact layer, free layer and barrier layer having a width equal to the width of the second photo-resist. A third etching is performed of the MTJ stack, using the portion of the oxide layer, to leave a second portion of the contact layer, a second portion of the free layer and a second portion of the barrier layer, each of the second portion of the contact layer, free layer and barrier layer having a width equal to the width of the portion of the oxide layer.

In some methods of the present invention, during the second etching step, a portion of the fixed layer and layers under the fixed layer are etched.

In some methods of the present invention, during the third etching step, etching is stopped after etching the barrier layer and the fixed layer and layers under the fixed layer are not etched.

Accordingly, since during the second etching step, the fixed layer and layers under the fixed layer are not etched, a significantly larger portion (as an example Ta layer) of the contact layer remains after all etching steps are completed that is better suitable for connecting the MTJ to circuits outside of the magnetic memory element.

Figure 1:
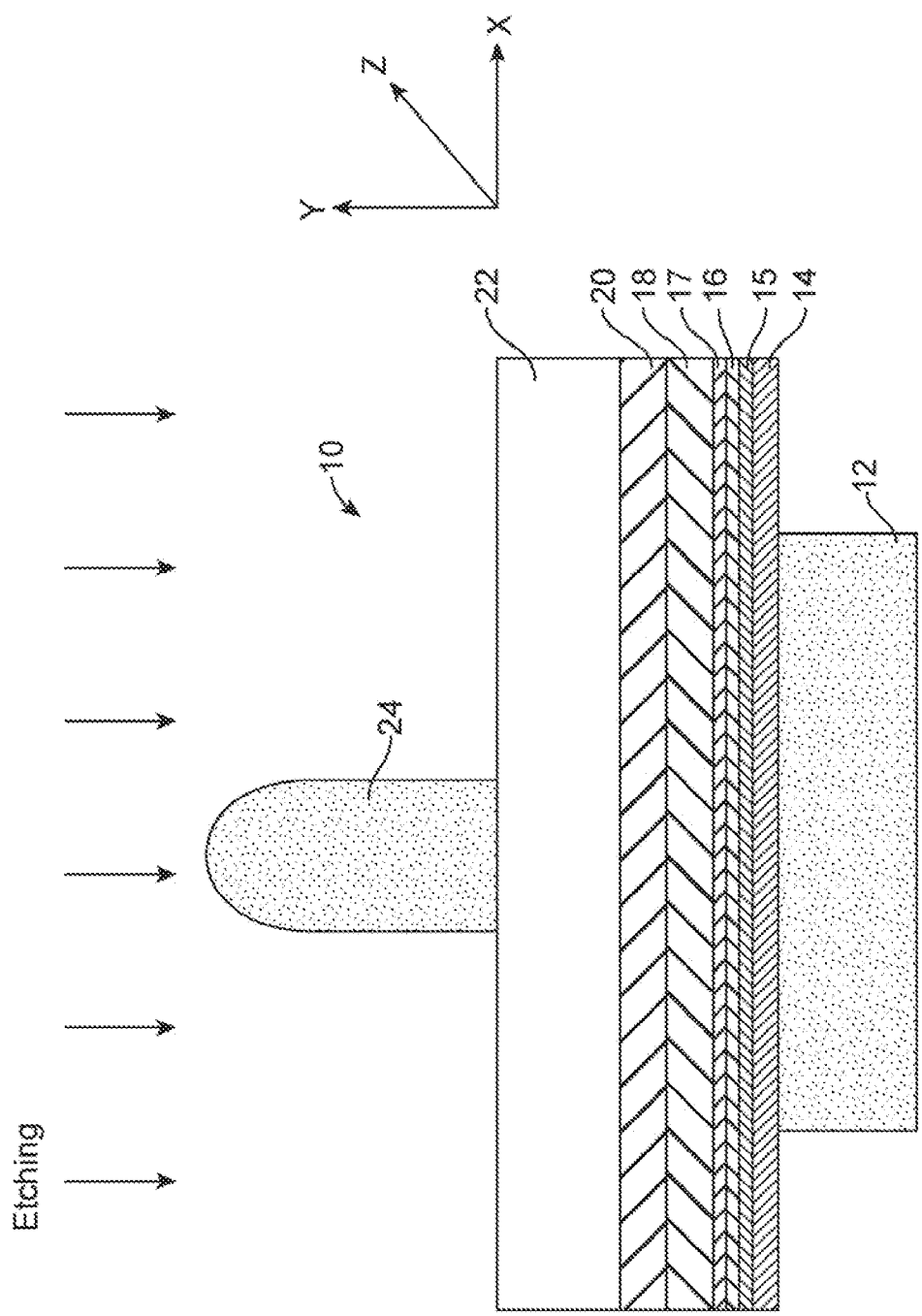
FIG. 1 shows a MRAM element 10, in accordance with a method and embodiment of the present invention.

Referring now to FIG. 1, in accordance with a method and embodiment of the present invention, a MRAM element 10 is shown where the MRAM element 10, at this step and during the formation thereof, is shown to include a bottom electrode 14, a fixed layer 15, a barrier layer 16, a free layer 17, and a contact layer 18. The layers 15, 16 and 17 collectively form a MTJ. An oxide layer 22 is shown formed on top of the contact layer 18. A photo-resist 24 is shown formed on a portion of the oxide layer 22. Optionally, a nitride layer 20 is formed on top of the contact layer 18 and below the oxide layer 22. Additionally optionally, a tantalum nitride layer (not shown in FIG. 1), is formed on top of the metal layer 12 and below the bottom electrode 14. It is understood that the metal layer 12 is formed on top of a substrate not shown in FIG. 1.

In some embodiments, the contact layer 17 is made of tantalum (Ta). In some embodiments, the bottom electrode 14 is made of Ta and the metal layer 12 is made of copper.

In those embodiments and methods where a tantalum nitride layer is employed, the tantalum nitride layer serves to protect the metal layer 12 and prevent it from oxidizing particularly during the times that the wafer is unused and idle during manufacturing, or during transportation as the element 10 is currently made in different fabrication facilities, in different stages, and is therefore subject to transportation damage. The various methods of the present invention serve to minimize and in some cases eliminate such damage.

The photo-resist 24 serves as a mask during etching of the oxide layer 22, which is performed to remove the oxide layer 22 except in a portion that is directly below the photo-resist 24 extending therebelow to the top of the nitride layer 20, in embodiments using this layer, otherwise extending to the top of the contact layer 18. In the dimension that is along the plane of the substrate, the portion of the oxide layer 22 that remains after etching is substantially the size of the width of the photo-resist 24 (along the x-axis in FIG. 1). The portion of the oxide layer 22, shown by reference number 30, in FIG. 2, remains after this etching process In some embodiments and methods, the oxide layer 22 is etched with compounds containing fluoride (F), such as Carbon tetra fluoride (CF4) or Sulfa hexa fluoride (SF6), or Tri-Chloro-Fluoro-methane (also referred to as "Freon (CCl3F)"). In some methods and embodiments, Ethel alcohol (C2H5OH) or CO with NH3 (Carbon mono-oxide with Amonia) is used to etch the free layer, the fixed layer and the barrier layer.

FIG. 2 shows the MRAM element 10 after etching of the oxide layer 22, using the photo-resist 24. As shown, the portion of the oxide layer 30 remains and is used for further etching as will be evident shortly. During the foregoing etching step, the photo-resist 24 is essentially also etched in its entirety.

FIG. 3 shows the step of depositing photo-resist 32 on top of and around the portion of the oxide layer 30 after the etching step of FIGS. 2 and 3. This is accomplished by deposition of photo resist and its exposure to the proper mask, in which all the ultraviolet (UV) light-exposed photo resist is developed away other than the portion 32 that is left unexposed to UV light. As shown, because the photo-resist 32 is formed around the oxide layer 30, some of it also covers a portion of the top of the layer 20. The photo-resist 32 serves as a mask to prevent removal of the portion of the layers thereunder up to the layer 12, during the next etching step. After the deposition of the photo-resist 32, the MTJ stack, defined by the bottom electrode 14, the MTJ and the contact layer 18 and in those cases where the nitride layer 20 is used, the nitride layer 20, is etched using carbon tetra fluoride (CF4) to form the structure shown in FIG. 4.

FIG. 4 shows the element 10 after the etching step of FIG. 3. The element 10 is shown to include the layer 12 and the portion of the oxide layer 30 and the photo-resist 32, but only a remaining portion of the layers 14, 15, 16, 18 and 20 are left after the etching step of FIG. 3 defined by the dimension of the photo-resist 32. That is, they each have the same width as the width of the photo-resist 32, assuming width is along the x-axis, and a length, along with y-axis, defined from the bottom of the photo-resist 32 and extending to the top of the layer 12.

Optionally, layer 14 is used to stop the foregoing etching thereby leaving the layer 14 un-etched and serving as a stop layer. Still optionally, the layer 14 is comprised of multiple layers with each layer being made of a different material and the bottom layer of the layer 14 serving as the stop layer with all other layers etched.

Next, another etching process is performed, using the photo-resist 32 as a mask to prevent removal of a certain desired portion of the layers 18, 20, 17 and 16, from being removed. This desired portion is substantially a width that is suitable to be the ultimate width of the free layer 17, which due to its switchable characteristic needs to have a certain area to allow sufficient current drivability but as small as possible to maintain switching current levels low. During the foregoing etching process, the fixed layer 15 need not be etched because it does not switch in its magnetic orientation once the element 10 is manufactured. However, the photo-resist 32 itself and the portion of the oxide layer 30 are removed during this etching step. The resulting structure of the element 10, after the foregoing etching step, is shown in FIG. 5.

FIG. 5 shows the element 10 after the etching step of FIG. 4. As stated above, the layers 20, 18 and 17 are etched to remove certain portions thereof but to leave the nitride layer 20', the contact layer 18', the free layer 17' and the barrier layer 15', each having a width defined by the width of the portion of the oxide layer 30 and a length that is substantially the same as the length they started with upon formation thereof. This advantageously substantially holds the length of the contact layer 17 in place with small reduction thereof thereby avoiding shorting of the fixed layer 14 when the MTJ of the element 10 is connected with circuitry outside of the element 10. In some embodiments, where the length of the contact layer 17 is approximately 600 Angstroms, the length of the contact layer 17', after the foregoing etching processes, is in the range of 400 to 500 Angstroms whereas prior art techniques reduce the length of this layer to a range of 100 to 200 Angstroms due to etching. This near four time increase in the length of the contact layer allows for reliable connection of the layer 18 (Ta layer) to the other elements of the MRAM.

In embodiments using the layer 14 as a stop layer, as discussed above, the layer 14 is etched with some portions removed and some remaining, as shown in FIG. 5.

It is noted that the layer 14 and 15 are sometimes etched to take on substantially the same width (length in the x-axis) as that shown for the layers 17', 18' and 20'.

FIG. 6 shows a MRAM element 50, in accordance with an embodiment and method of the present invention. The MRAM element 50, at this juncture, during the formation thereof, is shown to include a fixed layer 56 on top of which is shown formed a barrier layer 57, on top of which is shown formed a free layer 57, forming the MTJ of the element 50. Further shown is substrate 66 into a part of which a metal layer 64 is formed. On top of the layer 64 and the substrate 66 is shown formed a bottom electrode 52, on top of which is shown formed a contact layer, on top of which is shown formed the layer 56. Further shown is the tantalum layer 60 on top of the layer 58, and an oxide layer 62 formed on top of the layer 60. The oxide layer 62 serves as a hard mask protecting the Ta layer.

In some embodiments, the substrate 66 is made of oxide and the contact layer is made of Ta and the layer 64 is made of copper.

In some embodiments, the thickness of the layer 60 is greater than the thickness of the layer 54.

FIGS. 7-11 show the steps employed to manufacture the MRAM element 50, in accordance with a method of the present invention.

Figure 7:
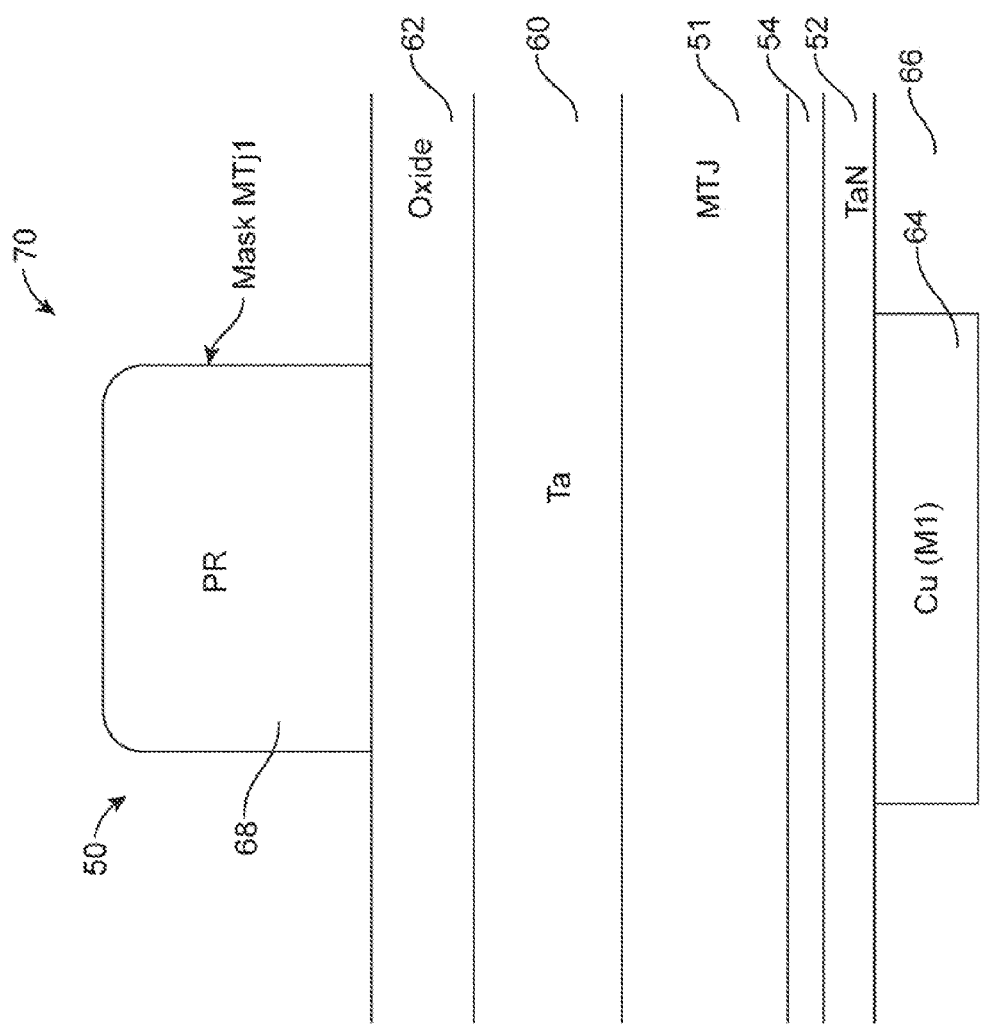

During the step 70, shown in FIG. 7, photoresist 68 is deposited on a portion of the top of the layer 62 and serves as the MTJ mask to protect a portion of layer 62 from being etched. During this step, the photoresist 68 is developed, as a mask, by being exposed. Next, at step 80, an etching process is performed to etch the layer 62 in areas not covered by the photoresist 68. The etching process, in some method, is reactive ion etching (RIE). Further, the photoresist 68 is also cleaned and removed because it is no longer needed to protect the layers thereunder. Further, another etching process is performed to etch the layer 60. The Ta layer is etched with RIE using CF4 or CCl4 or similar gases.

Figure 8:
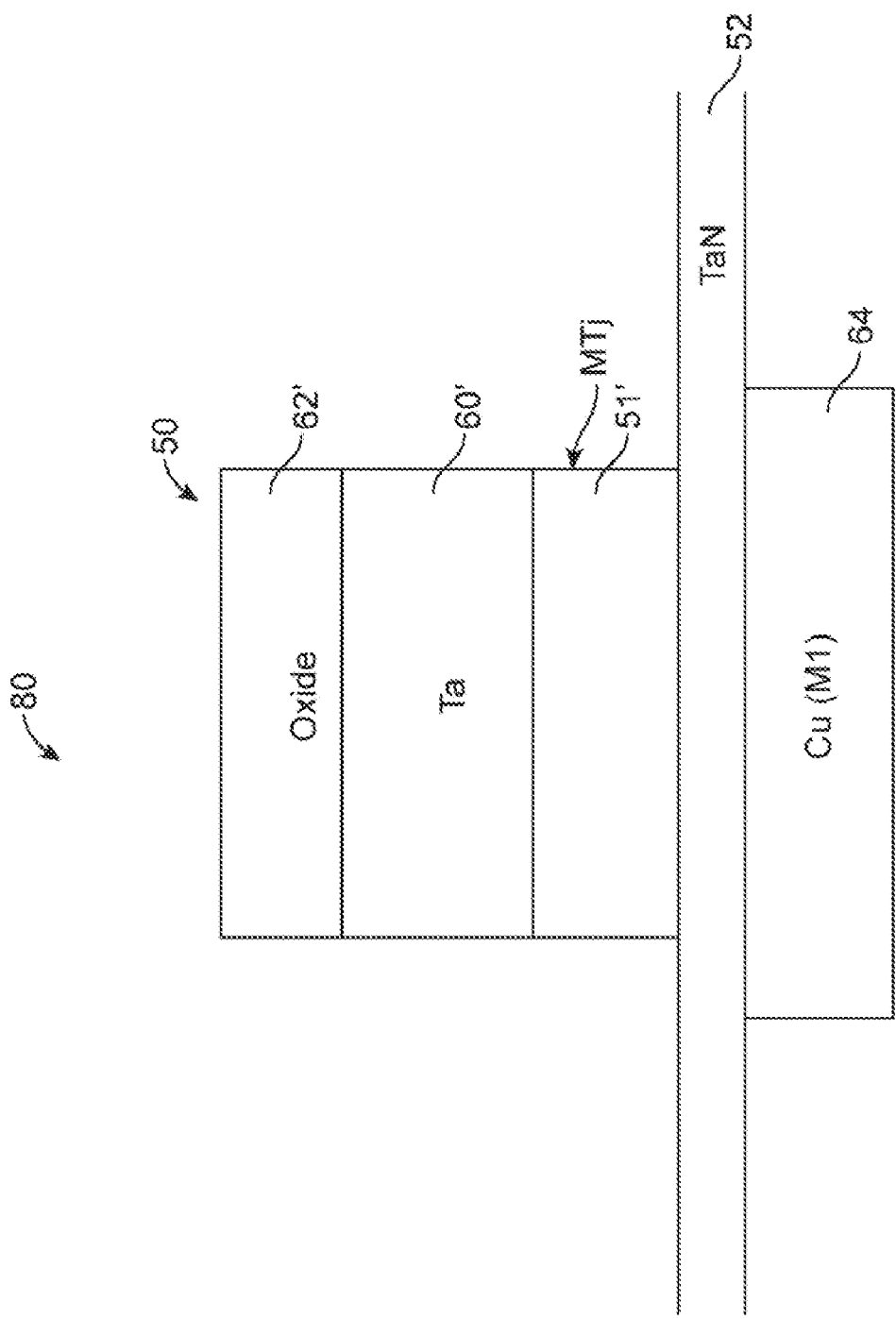

Next, at step 80 of FIG. 8, the MTJ 51 is etched using C2H5OH or CO and NH3. In the foregoing etching steps, the MTJ 51, layer 60 and layer 62 are etched to remove them but not in their entirety, rather, the portion of these layers that are below the photoresist 68 and have a width substantially equal to the width of the photoresist 68 remains after etching. The portions of these layers that remain are referred to herein as the MTJ 51', the tantalum layer 60' and the oxide layer 62'.

Figure 9:
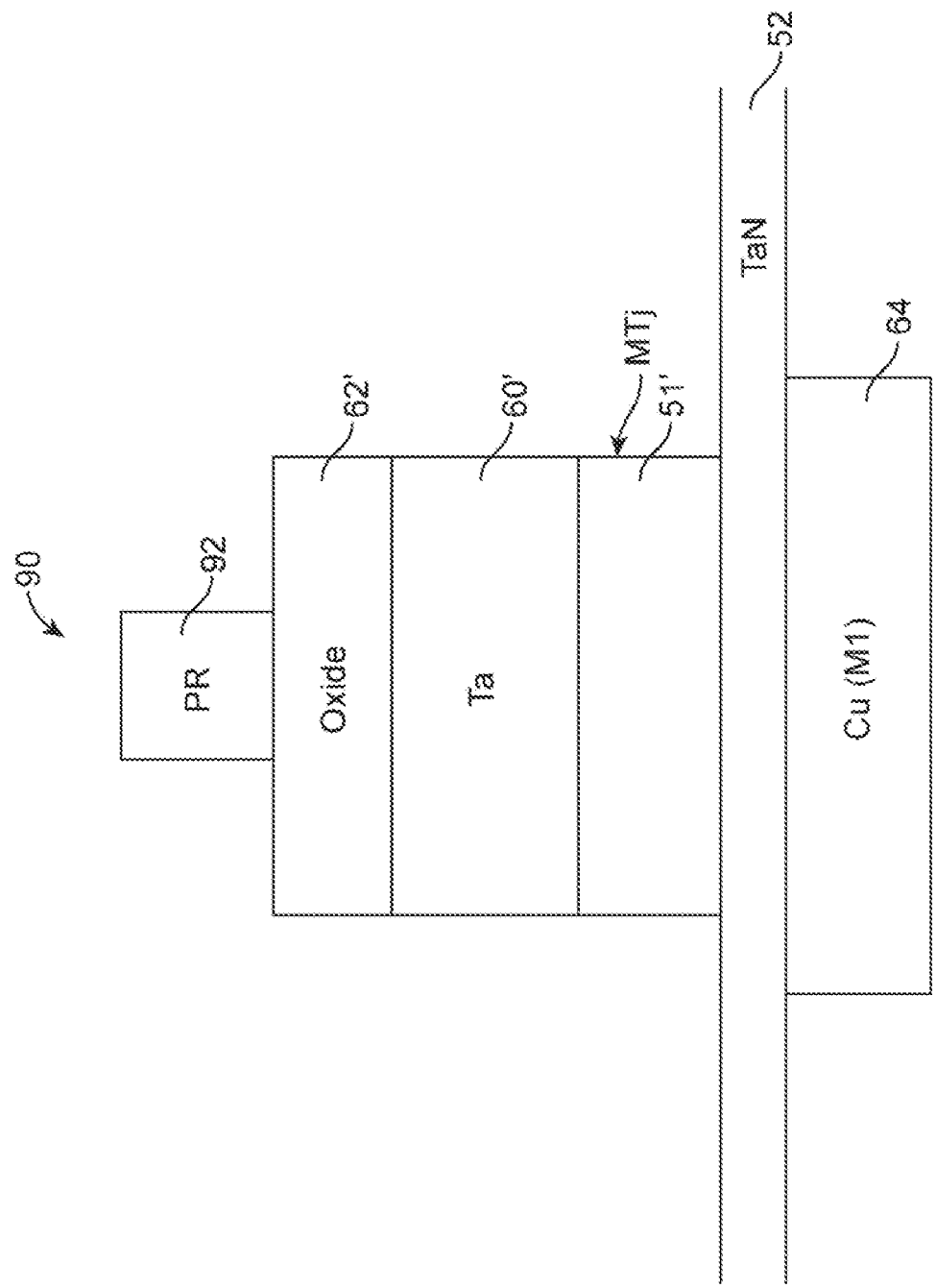

Next, at step 90 of FIG. 9, photoresist 92 is deposited on a portion of the top of the layer 62'. The width of the photoresist 92 defines the desired width of the MTJ after completion of manufacturing thereof. The photoresist 92 serves as a mask, as the photoresist 68 did. Thus, this process uses double-mask for defining the ultimate MTJ. The photoresist 92, similar to the photoresist 68 is developed by masking the MTJ 51 and exposing.

Figure 10:
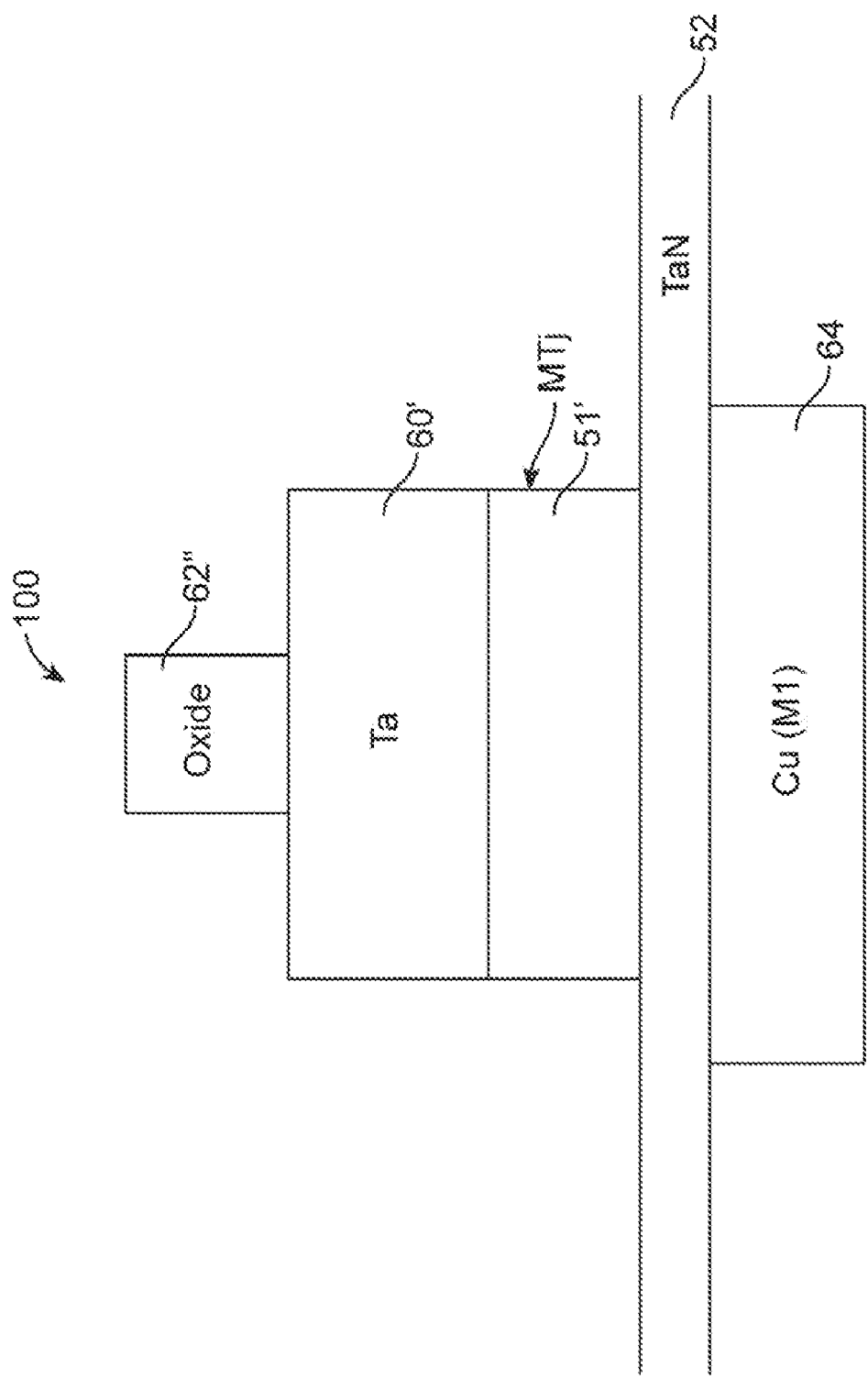

FIG. 10 shows the next step 100 that is performed where the layer 62' is etched to remove this layer but only in areas that are not under the phororesist 92. The area of the layer 62' that removes is referred to as oxide layer 62". The same etching method as that used to etch the layer 68 is used. Further, the photoresist 92 is removed/cleaned.

Figure 11:
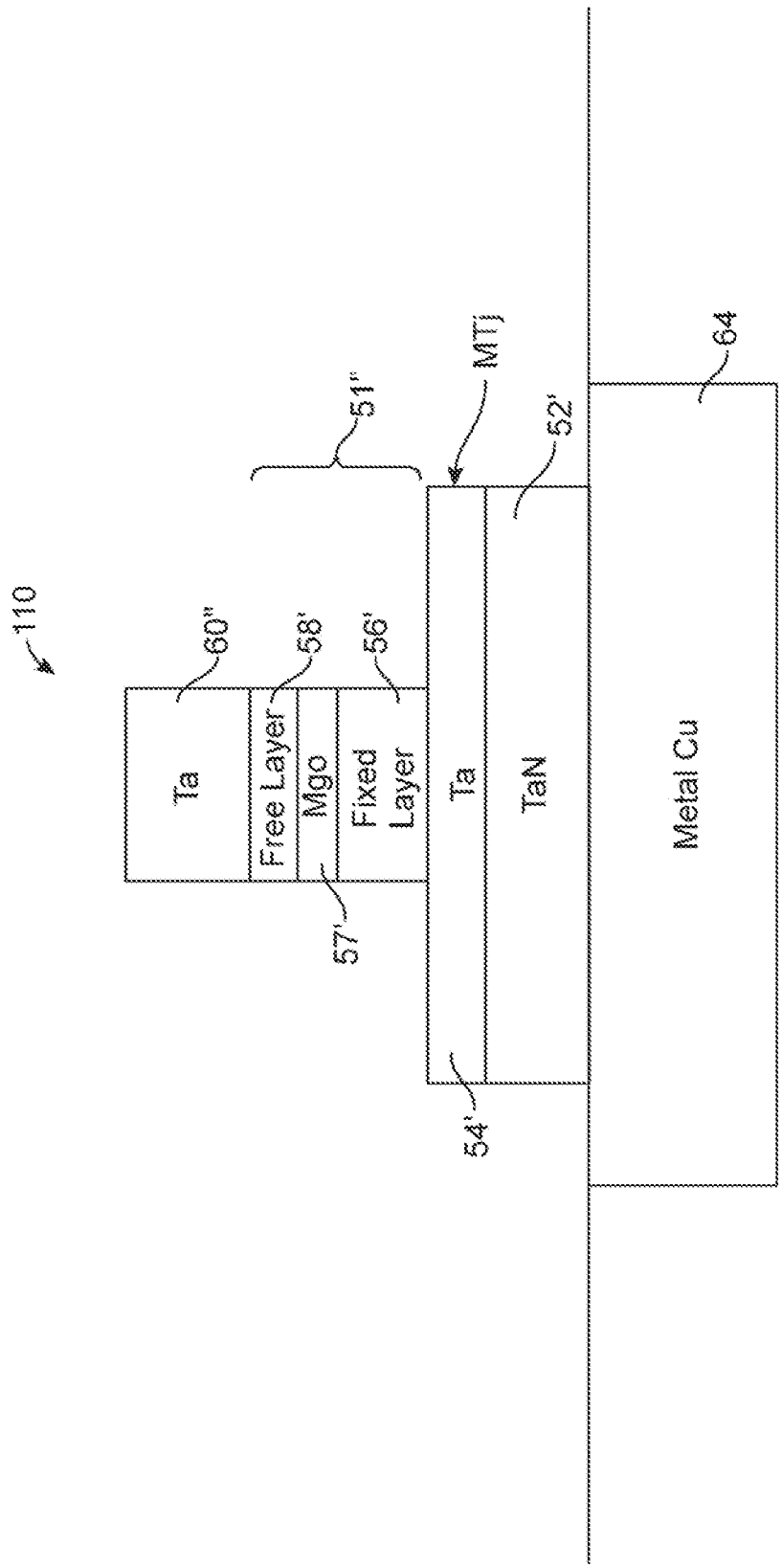

FIG. 11 shows the next step 110, where the layer 60' is etched and the MTJ 51' is etched using the same etching methods as that of the element 10. These layers are etched to leave behind MTJ 51" having a width substantially the same as the width of the photoresist 62". The remaining portions of these layers is referred to as fixed layer 56', barrier layer 57' and free layer 58, which collectively form the MTJ 51". Further, tantalum layer 60" remains.

Further after this step, the layer 52 and the contact layer are not etched and are left intact, referred to as contact layer 54' and layer 52'.

It is noted that optionally, not all of the MTJ is etched, rather; at least the free layer of the MTJ is etched. It is also noted that during this step, etching causes removal of the layer 62' in substantially its entirety. The etching used during this step is similar to that which is described relative to FIGS. 4 and 5.

In another method of manufacturing a magnetic memory element, in accordance with another method of the invention, a bottom electrode is formed on top a metal layer, followed by forming a permanent magnetic layer on top the bottom electrode, and forming a pinning layer on top the permanent magnetic layer, forming a magnetic tunnel junction (MTJ) including a barrier layer on top of the pinning layer, forming a top electrode on top of the MTJ, forming a hard mask on top of the top electrode, and using the hard mask to perform a series of etching processes to reduce the width of the MTJ and the top electrode to substantially a desired width, where one of these etching processes is stopped when a predetermined material in the pinning layer is detected thereby avoiding deposition of metal onto the barrier layer of the etching process thereby preventing shorting.

FIGS. 12-18 show the steps employed in manufacture the MRAM element 110, in accordance with a method of the invention.

Figure 12:
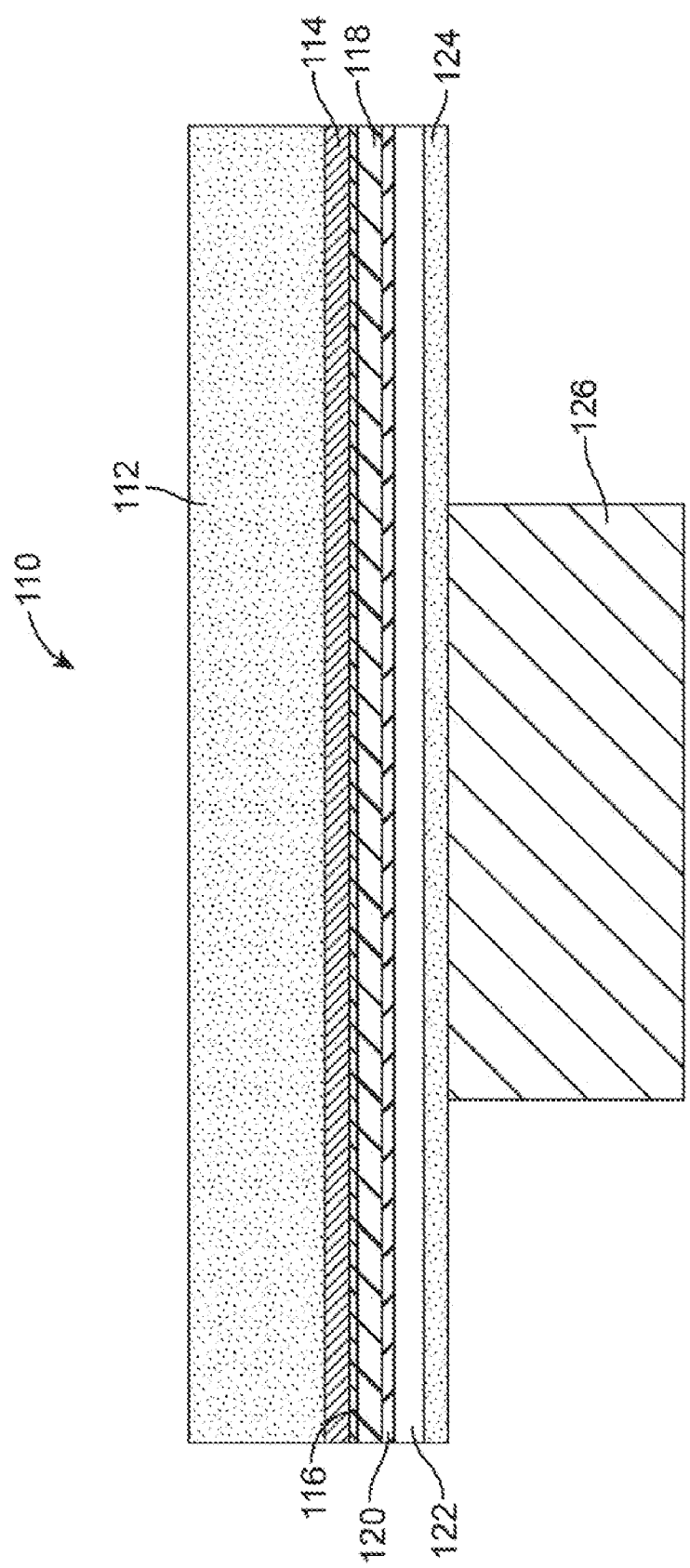

Referring now to FIG. 12, in accordance with a method and embodiment of the invention, a MRAM element 110 is shown where the MRAM element 110, at this step and during the formation thereof, is shown to include a contact layer 124, shown partially formed on top of a metal layer (Ml) 126. Further, the element 110 is shown to have a permanent magnetic layer 122 formed on top of the seed layer 124, a pinning layer 120 formed on top of the layer 122, a fixed layer 118 formed on top of the layer 120, a barrier layer 16 formed on top of the layer 118, a free layer 114 formed on top of the layer 116, and a top electrode 112 formed on top of the layer 114. The layer 124 is also referred to herein as the "bottom electrode" or "BE" or "seed" layer. It is noted that in some embodiments, the bottom electrode 124 also serves as a seed layer for proper crystallization of the layers that are formed on top of it. The layers 118, 116 and 114 collectively form a MTJ of the element 110.

The layer 120 magnetically couples the permanent magnetic layer 122 to the fixed layer 118 thereby preventing the fixed layer 118 from changing its magnetic orientation.

A photo-resist 30 is shown formed on a portion of the oxide layer 128. Optionally, a nitride layer may be formed on top of the layer 124 and below the layer 122. Additionally optionally, a tantalum nitride layer (not shown in FIG. 12), is formed on top of the metal layer 126 and below the bottom electrode 24. It is understood that the metal layer 112 is formed on top to make connection to MTJ.

In some embodiments, the layer 124 and the top electrode are each made of tantalum (Ta) and the metal layer 126 is made of copper. Further, in some embodiments, the layer 122 is made of the alloy cobalt-iron-boron (Co—Fe—B) and similarly, the layers 114 and 118 are made of the alloy Co—Fe—B. in some embodiments, the layer 120, the pinning layer is made of platinum-manganese (Pt—Mn).

The layers shown in FIG. 12 are of suitable thickness and sizes.

The layer 126 is a metal inter-connect layer and is typically formed in or on the substrate (not shown) and is commonly referred to as "Mx" or metal layer, serving to connect the element 10 with other circuitry (not shown) such as control circuits, access transistor, and the like. The element 110, in FIG. 12, is etched with the result of this etching process shown in FIG. 13.

Figure 13:
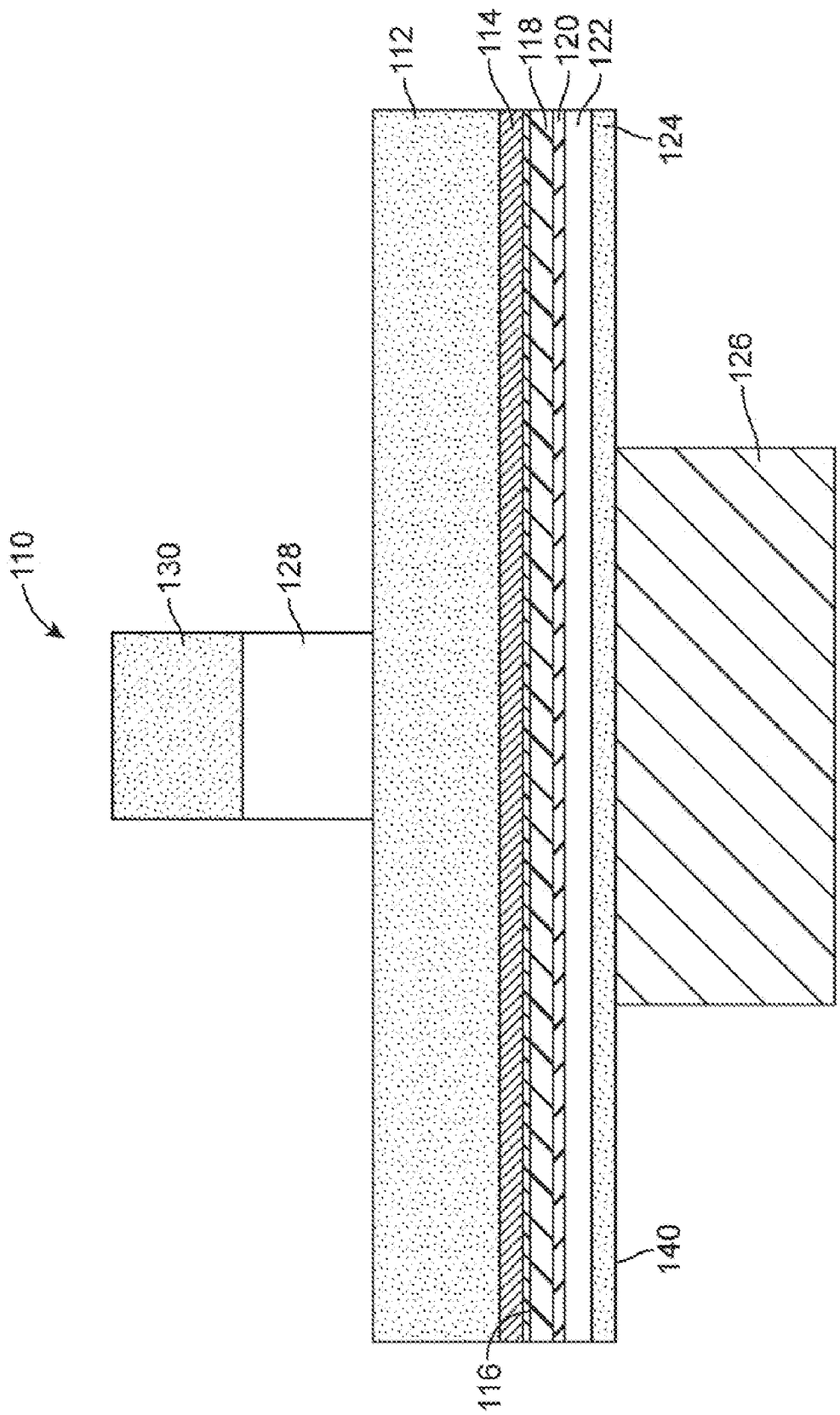

FIG. 13 shows deposition of the hard mask 128 and the photo-resist 130 on top the structure of FIG. 1. The hard mask material could be oxide or nitride or variety of other materials, in some cases it can be illuminated totally, and use the photo-resist only. Further shown in FIG. 13, are the results of the etching of the hard mask, referred to above with reference to FIG. 12, The line 140 is shown to merely indicate the level at which the MTJ layers are deposited and is not intended as a part of the structure of the element 110. Upon the completing of the foregoing etching step, the etched top electrode 112' and the etched MTJ (made of the etched layers 114', 116', and 118') are formed and a hard mask 128 is deposited on top of the top electrode 112' and the photo-resist 130 is formed on top of the hard mask 128. In some embodiments, the hard mask 128 is made of oxide.

The photo-resist 124 serves as a mask during a further etching step that causes etching of the hard mask 128. This additional etching step, in some embodiments and methods is done using dry etching techniques, in which the layer 112 is etched with Cl2, or CF4, or CCl3F, and layers 114, 116, and 118 are etched with CH3OH, or CO. The photo-resist 130 is removed during the step(s) of FIG. 13 when etching is performed.

Figure 14:
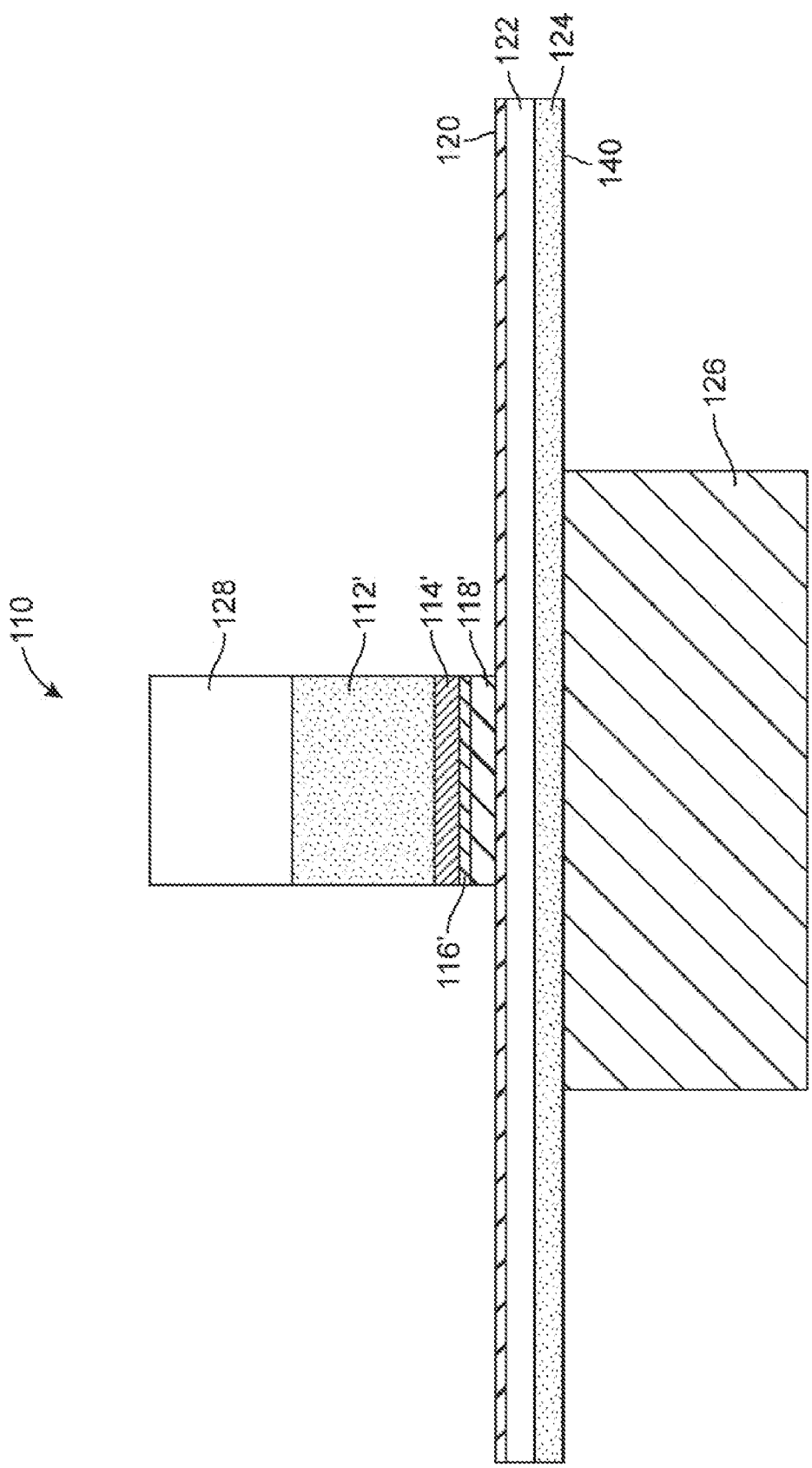

FIG. 14 shows the element 110, after the second etching step, where the layers 118, 116, 114, and 112 are etched to form the layers 118', 116', 114', and 112' with a width that is approximately that of the hard mask 128.

As earlier noted, in some embodiments and methods, the layers 112', 114', and 118' are etched in the additional etching step of FIG. 14 with compounds containing fluoride (F), such as Carbon tetra fluoride (CF4) or Sulfa hexa fluoride (SF6), or Tri-Chloro-Fluoro-methane (also referred to as "Freon (CCl3F)"). In some methods and embodiments, Ethel alcohol (C2H5OH) or CO with NH3 (Carbon mono-oxide with Amonia) is used to etch the free layer, the fixed layer and the barrier layer.

The etching process of the layers 118', 116', 114', and 112' is advantageously stopped when the material manganese, in the layer 120' is detected. This advantageously prevents etching of the layers 124' and 122' to avoid the risk of re-deposition of metal onto the layer 116', as experienced in prior art techniques. That is, copper from the layer 26 is not re-deposited onto the barrier layer nor is any metal from the layers 124' and 122', which are both made of metal material. Thus, shorting between the fixed and free layers of the MTJ of the element 110 is prevented.

Figure 15:
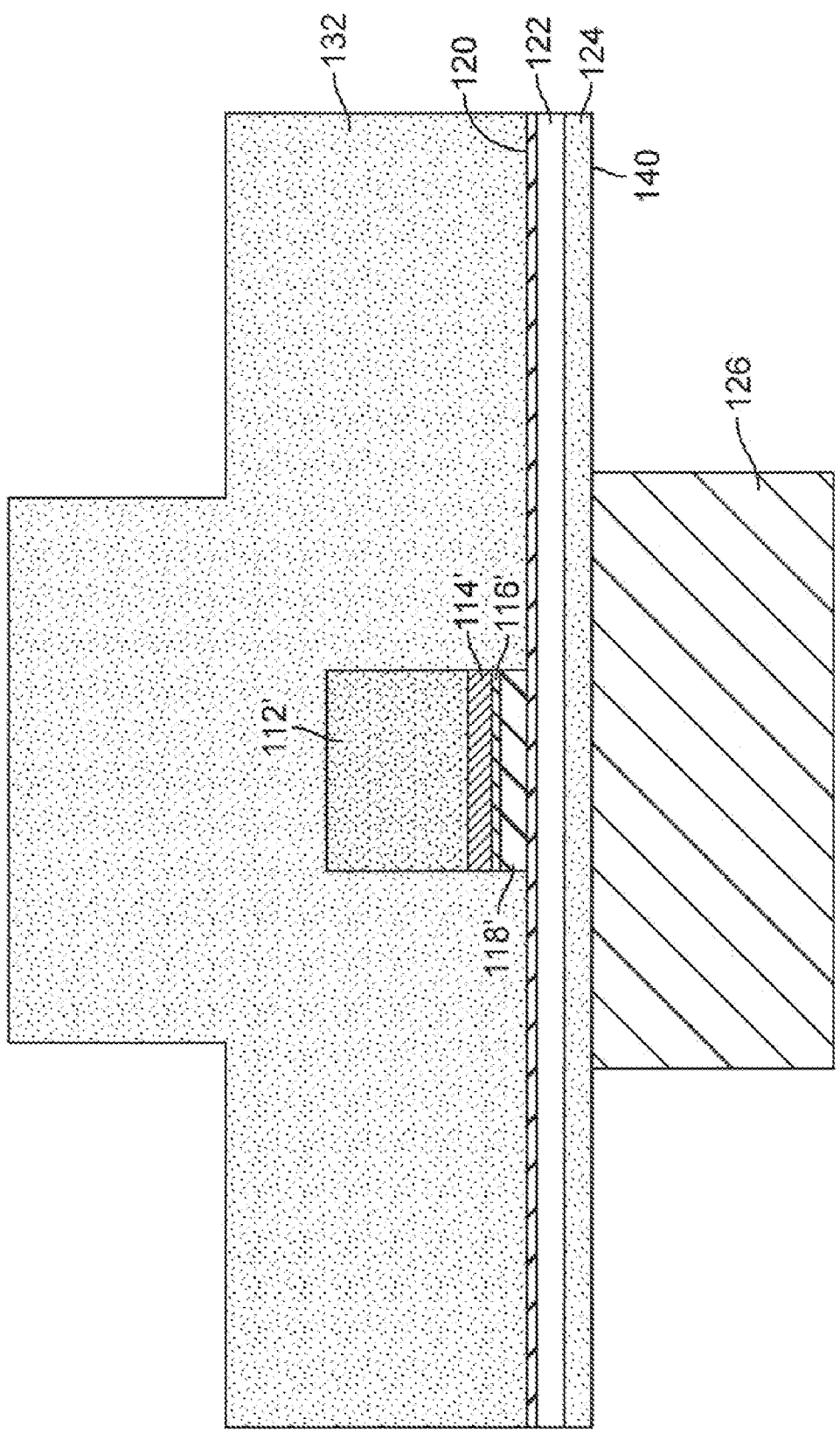

Next, in FIG. 15, a dielectric layer 132 is deposited on top of and around the layers 118', 116', 114', and 112' and on top of and around the layer 120. In some embodiments, the layer 132 is made of silicon nitride (Si3N4). Most any dielectric material, such as silicon nitride, or deposited silicon dioxide or carbon-doped silicon dioxide (SiO2), can form the layer 132. The purpose of this layer is primarily is to form a flat surface on top of the wafer.

The layer 132 has a dome-type shape in that it is higher in areas that are directly on top of the layers 112'-118'. This is due to the difference in height of the layers 112' to 118' relative to the layers 126 to 120'.

Figure 16:
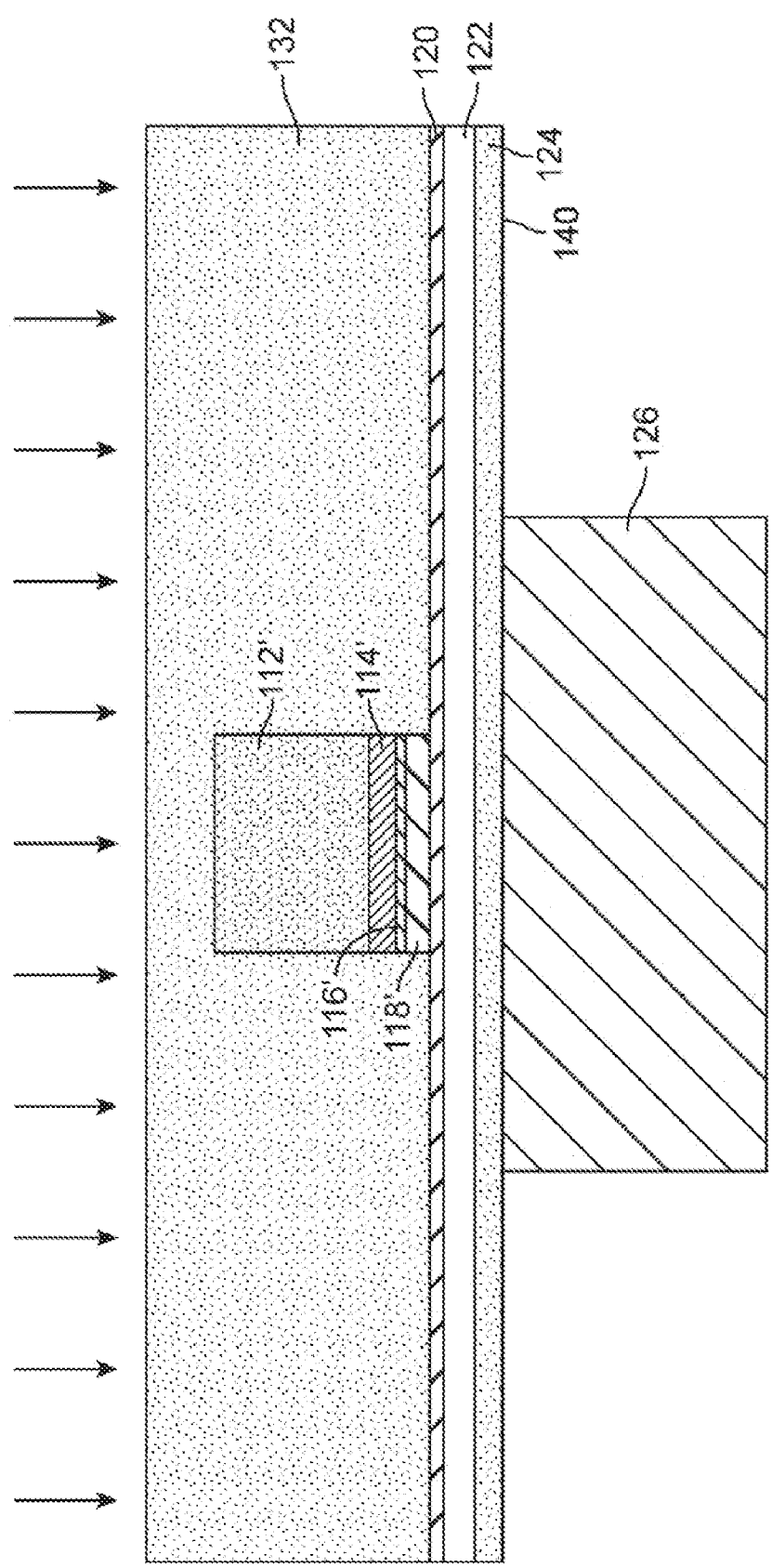

Next, in FIG. 16, a chemical mechanical polishing (CMP) process is performed on the structure of the element 110, shown in FIG. 15, resulting in the structure of the element 110, shown in FIG. 16. CMP results in flattening the top or dome-type structure of the element 110 and leaves a substantially uniform-sized top of this layer. After CMP, the etched dielectric layer 132' is formed from the layer 132, having a width that is substantially the same size as that of the MTJ and the etched top electrode 112'.

Next, a third etching step is performed to scale back the width of the layer 132 to be suitably over the top and around the layers 112'-118' and no more, as shown in FIG. 16 to protect the layer 116 from re-deposition during a further etching process. The layer 132, after etching is shown in FIG. 16 to form the layer 132'. That is, the area of the layer 132' that is left on top and around these layers is sufficient to protect the layer 116' in further etching step(s), discussed below.

Figure 17:
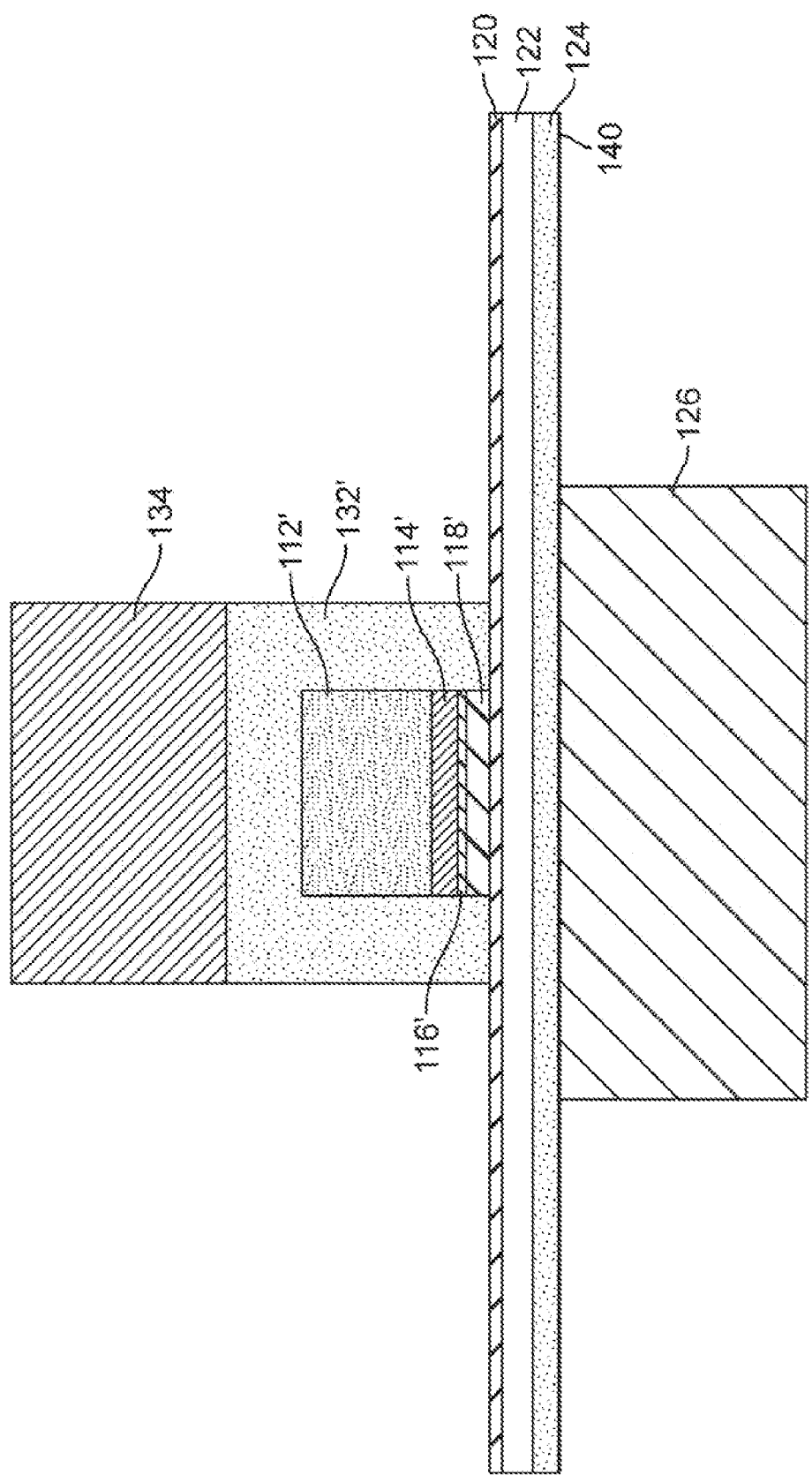
Figure 18:
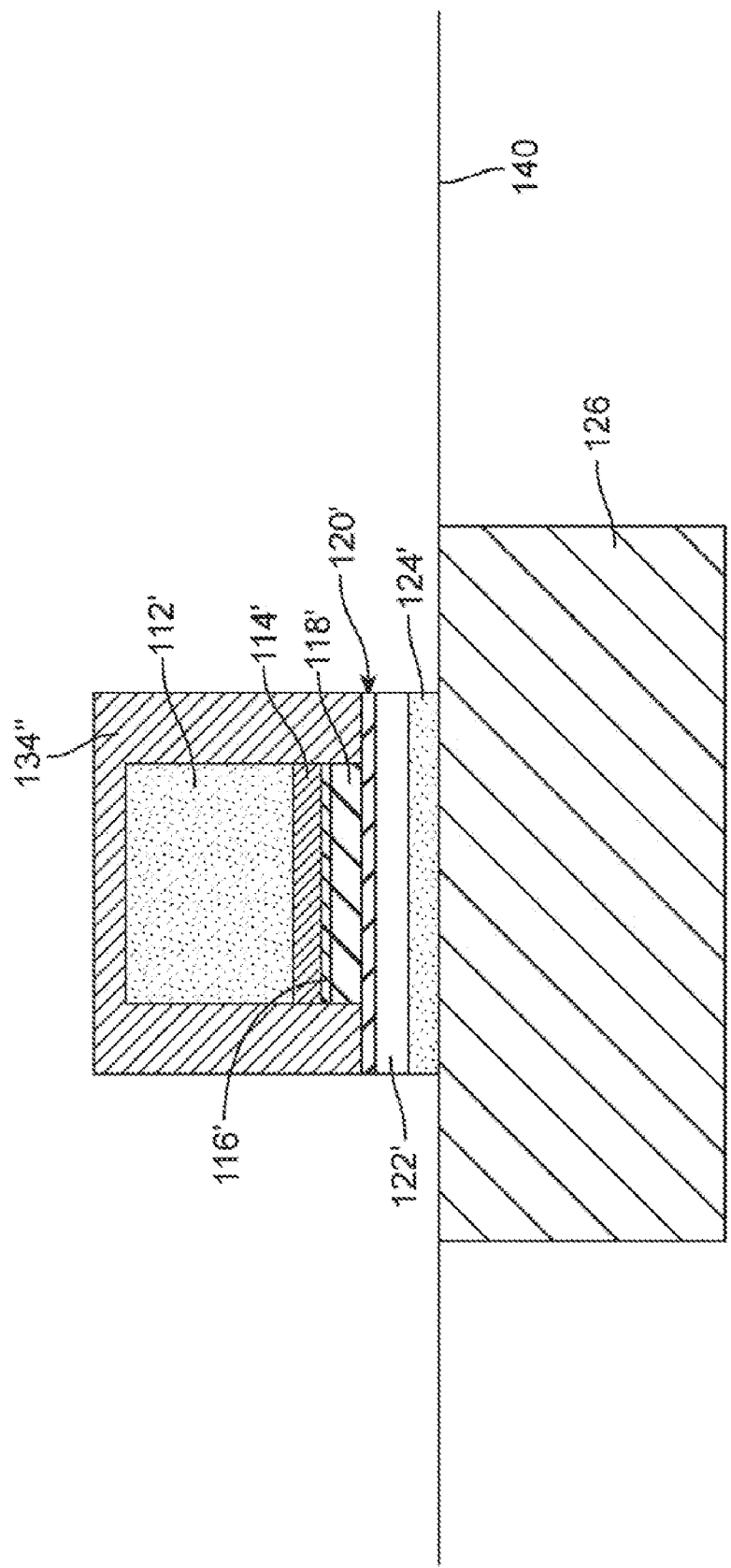

In FIG. 17, another masking process begins by forming another photo-resist 134 on top of the layer 132'. The photo-resist 34 serves to protect the layer 116' when a third etching step is performed in FIG. 17. In this process the layer 132 is etched using Cl2, of CF4 or similar gases. Next, as discussed above, before alcohol or CO can be used to etch the layers 120, and 122. The bottom electrode 124 can be etched by CF4, Ar, or similar gases. During this etching step, the photo-resist 134 is removed resulting in the structure of the element 110 being that shown in FIG. 18. The protection of the layer 116' by using the size of the layer 132' that is sufficient to protect the edges of the layer 116' from possible re-deposition of metal and therefore shorting, ensures reliability of the element 110.

In some embodiments, the bottom electrode 124 is made of heavy materials, such as tantalum (Ta) and tantalum nitride (TaN), or titanium nitride (TiN), or combination thereof.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of manufacturing a magnetic memory element comprising:

forming a permanent magnetic layer on top of a bottom electrode;

forming a pinning layer on top the permanent magnetic layer;

forming a magnetic tunnel junction (MTJ) including a barrier layer on top of the pinning layer;

forming a top electrode on top of the MTJ;

forming a hard mask on top of the top electrode;

using the hard mask, performing a plurality of etching processes to reduce the width of the MTJ and the top electrode to substantially a desired width; and stopping one of the plurality of etching processes when detecting a predetermined material in the pinning layer thereby avoiding deposition of metal onto the barrier layer of the MTJ during the performing a plurality of etching processes step.

2. The method of manufacturing, as recited in claim 1, wherein further forming a fixed layer on top of the pinning layer and a free layer on top of the barrier layer, the fixed layer, the barrier layer and the free layer collectively forming the MTJ.

3. The method of manufacturing, as recited in claim 2, wherein the fixed layer and the free layer each including metal material.

4. The method of manufacturing, as recited in claim 3, wherein further forming photo-resist on top of the hard mask prior to the performing a plurality of etching processes step.

5. The method of manufacturing, as recited in claim 4, wherein the performing a plurality of etching processes step includes a first etching step, using the hard mask and photo-resist, to form an etched top electrode and an etched MTJ.

6. The method of manufacturing, as recited in claim 5, further including forming a dielectric layer on top and around the MTJ and the top electrode and on top of the pinning layer.

7. The method of manufacturing, as recited in claim 6, wherein the dielectric layer is made of silicon nitride.

8. The method of manufacturing, as recited in claim 6, further including the step of chemical mechanical polishing to form a substantially flat surface on top of the dielectric layer.

9. The method of manufacturing, as recited in claim 8, wherein the performing of a plurality of etching processes includes a second etching step to form an etched dielectric layer.

10. The method of manufacturing, as recited in claim 9, further including forming a second photo-resist on top of the dielectric layer.

11. The method of manufacturing, as recited in claim 10, wherein the performing step of claim 1 further includes a third etching step during which detecting the predetermined material in the pinning layer and thereafter stopping the third etching step.

12. The method of manufacturing, as recited in claim 11, wherein the predetermined material is manganese.

13. The method of manufacturing, as recited in claim 11, wherein forming the bottom electrode on top of a metal layer.

14. The method of manufacturing, as recited in claim 13, wherein the metal layer being formed of copper.

15. The method of manufacturing, as recited in claim 14, wherein preventing copper from being deposited onto the barrier layer of the MTJ during the performing step of claim 1.

16. The method of manufacturing, as recited in claim 11, wherein the dielectric material sufficiently surrounding the MTJ to prevent deposition of metal onto the barrier layer of the MTJ thereby preventing shorting during the performance of the plurality of etching processes.

17. The method of manufacturing, as recited in claim 1, wherein the bottom electrode is made of tantalum (Ta) and tantalum nitride (TaN), or titanium nitride (TiN).

* * * * *